(12) United States Patent
Hung et al.

(10) Patent No.: US 9,093,285 B2
(45) Date of Patent: Jul. 28, 2015

(54) SEMICONDUCTOR STRUCTURE AND PROCESS THEREOF

(71) Applicant: UNITED MICROELECTRONICS CORP., Hsin-Chun (TW)

(72) Inventors: Ching-Wen Hung, Tainan (TW); Chih-Sen Huang, Tainan (TW); Po-Chao Tsao, New Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 33 days.

(21) Appl. No.: 13/848,736

(22) Filed: Mar. 22, 2013

(65) Prior Publication Data
US 2014/0284671 A1    Sep. 25, 2014

(51) Int. Cl.
| | | |
|---|---|---|
| *H01L 27/108* | (2006.01) | |
| *H01L 27/06* | (2006.01) | |
| *H01L 21/28* | (2006.01) | |
| *H01L 49/02* | (2006.01) | |
| *H01L 29/49* | (2006.01) | |
| *H01L 29/51* | (2006.01) | |
| *H01L 29/66* | (2006.01) | |

(52) U.S. Cl.
CPC ............ *H01L 27/0629* (2013.01); *H01L 21/28* (2013.01); *H01L 27/1085* (2013.01); *H01L 28/60* (2013.01); *H01L 29/4966* (2013.01); *H01L 29/51* (2013.01); *H01L 29/66545* (2013.01)

(58) Field of Classification Search
CPC ............................ H01L 27/0629; H01L 28/90
USPC .......... 257/296, 300, E27.016, E29.218, 308; 438/171, 190
See application file for complete search history.

(56) References Cited

U.S. PATENT DOCUMENTS

| | | | |
|---|---|---|---|
| 6,855,607 B2 | 2/2005 | Achuthan et al. | |
| 7,013,446 B2 | 3/2006 | Ohba et al. | |
| 7,112,495 B2 | 9/2006 | Ko et al. | |
| 7,250,658 B2 | 7/2007 | Doris et al. | |
| 7,521,324 B2 | 4/2009 | Ohmi et al. | |
| 7,531,437 B2 | 5/2009 | Brask et al. | |
| 7,592,270 B2 | 9/2009 | Teo et al. | |
| 8,431,962 B2 * | 4/2013 | Heying et al. ................. | 257/194 |
| 2007/0015365 A1 | 1/2007 | Chen et al. | |
| 2007/0072376 A1 | 3/2007 | Chen et al. | |
| 2007/0218661 A1 | 9/2007 | Shroff et al. | |
| 2008/0061366 A1 | 3/2008 | Liu et al. | |
| 2009/0057759 A1 | 3/2009 | Obradovic et al. | |
| 2009/0124097 A1 | 5/2009 | Cheng | |
| 2009/0200494 A1 | 8/2009 | Hatem et al. | |
| 2010/0044783 A1 | 2/2010 | Chuang et al. | |
| 2010/0048027 A1 | 2/2010 | Cheng et al. | |

(Continued)

*Primary Examiner* — Jarrett Stark
*Assistant Examiner* — Shahed Ahmed
(74) *Attorney, Agent, or Firm* — Winston Hsu; Scott Margo

(57) ABSTRACT

A semiconductor structure includes a metal gate, a second dielectric layer and a contact plug. The metal gate is located on a substrate and in a first dielectric layer, wherein the metal gate includes a work function metal layer having a U-shaped cross-sectional profile and a low resistivity material located on the work function metal layer. The second dielectric layer is located on the metal gate and the first dielectric layer. The contact plug is located on the second dielectric layer and in a third dielectric layer, thereby a capacitor is formed. Moreover, the present invention also provides a semiconductor process forming said semiconductor structure.

13 Claims, 6 Drawing Sheets

(56) References Cited

U.S. PATENT DOCUMENTS

| | | |
|---|---|---|
| 2010/0129994 A1 | 5/2010 | Awad et al. |
| 2012/0139049 A1 | 6/2012 | Kanike |
| 2012/0309158 A1* | 12/2012 | Hung et al. ............ 438/301 |
| 2013/0105912 A1* | 5/2013 | Hsu et al. ............ 257/379 |
| 2013/0146953 A1* | 6/2013 | Cheng et al. ............ 257/296 |
| 2013/0146959 A1* | 6/2013 | Cheng et al. ............ 257/310 |
| 2013/0175596 A1* | 7/2013 | Cheng et al. ............ 257/310 |

* cited by examiner

US 9,093,285 B2

SEMICONDUCTOR STRUCTURE AND PROCESS THEREOF

BACKGROUND OF THE INVENTION

1. Field of the Invention

The present invention relates generally to a semiconductor structure and a process thereof, and more specifically to a semiconductor structure and a process thereof that integrates capacitors and transistors.

2. Description of the Prior Art

Each capacitor in a semiconductor component usually includes two electrodes and a dielectric layer between the two electrodes. This structure has been widely used in many semiconductor components such as dynamic random access memories (DRAM). A capacitor process often includes the following steps: a conductive layer is formed on a substrate and is patterned to form a lower electrode of the capacitor; a dielectric layer is formed on the lower electrode; then, another conductive layer covers the dielectric layer to form the capacitor.

The materials of the electrodes may include polysilicon, polycide and metal. Thus, there are three fabricating methods for forming three kinds of capacitors in semiconductor wafer industry: Metal-insulator-Metal (MIM) capacitors, Poly-insulator-Poly (PIP) capacitors and Metal Oxide Semiconductor (MOS) capacitors to be compatible with CMOS transistor processes, for achieving process simplification. A MIM capacitor is constituted by two metals serving as electrodes. A PIP capacitor is constituted by two polysilicon layers serving as electrodes. A MOS capacitor is constituted by connecting a source and a corresponding drain of a MOS transistor serving as one electrode while a gate of the MOS transistor serves as the other electrode.

As the integration of an integrated circuit increases and sizes of its semiconductor components shrink, it becomes a great issue to integrate these components such as capacitors and transistors in the industry to achieve a desired capacitance and an operation power, and simplify processes and reduce processing costs.

SUMMARY OF THE INVENTION

The present invention provides a semiconductor structure and a process thereof, which forms electrodes of capacitors together with gates and contact plugs of transistors to integrate transistors and capacitors in the same semiconductor structure while simplifying processes and therefore reducing processing costs.

The present invention provides a semiconductor structure including a metal gate, a second dielectric layer and a contact plug. The metal gate is located on a substrate and in a first dielectric layer, wherein the metal gate has a work function metal layer having a U-shaped cross-sectional profile and a low resistivity material located on the work function metal layer having a U-shaped cross-sectional profile. The second dielectric layer is located on the metal gate and the first dielectric layer. The contact plug is located on the second dielectric layer and in a third dielectric layer, thereby forming a capacitor.

The present invention provides a semiconductor process including the following step. A first dielectric layer is formed on a substrate. A metal gate is formed in the first dielectric layer, and the metal gate has a work function metal layer having a U-shaped cross-sectional profile and a low resistivity material located on the work function metal layer having a U-shaped cross-sectional profile. A second dielectric layer is formed on the metal gate and the first dielectric layer. A third dielectric layer is formed on the second dielectric layer. A contact plug is formed in the third dielectric layer and in the vertical direction of the metal gate, thereby forming a capacitor.

According to the above, the present invention provides a semiconductor structure and a process thereof, which integrates a capacitor process and a MOS transistor process to form transistors and capacitors by the same process, thereby simplifying processing steps and reducing processing costs. More specifically, a lower electrode of a capacitor is formed together with a metal gate of a MOS transistor; a second dielectric layer is covered on the MOS transistor and the lower electrode of the capacitor to be an insulating layer of the capacitor and insulating the MOS transistor from upwards; and a top electrode of the capacitor is formed together with a contact plug of the MOS transistor, which electrically connects the MOS transistor outwards.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
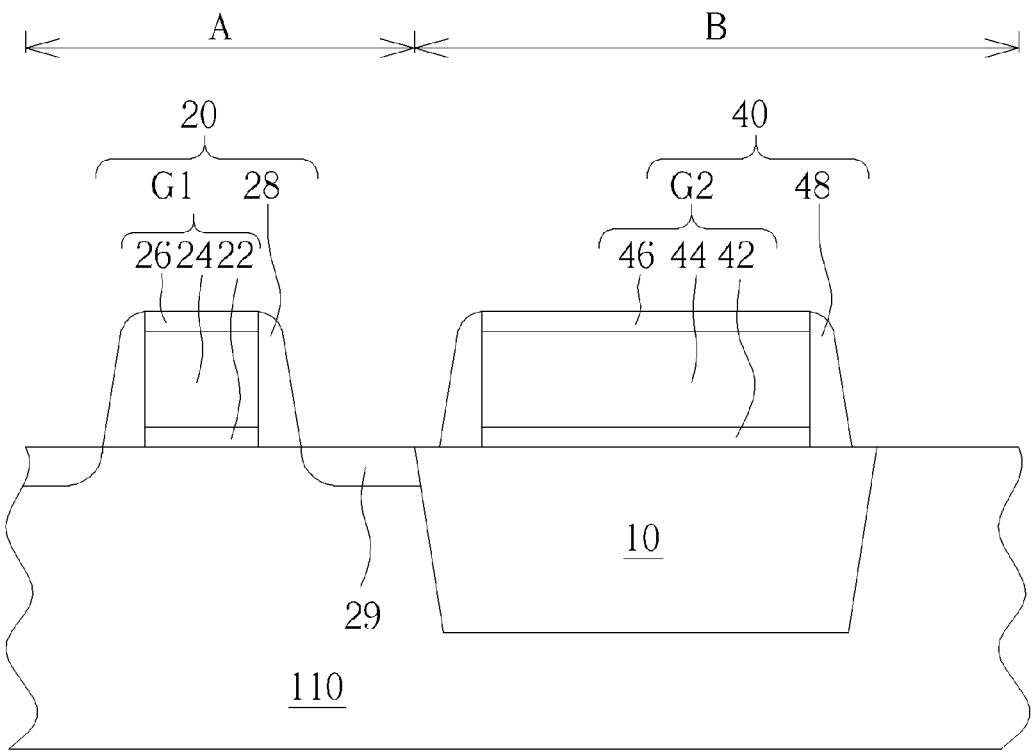
FIGS. 1-9 schematically depict cross-sectional views of a semiconductor process according to an embodiment of the present invention.

FIGS. 1-9 schematically depict cross-sectional views of a semiconductor process according to an embodiment of the present invention. As shown in FIG. 1, a substrate 110 is provided, wherein the substrate 110 has a first area A and a second area B. In this embodiment, the first area A is a transistor area for forming a MOS transistor therein, and the second area B is a capacitor area for forming a capacitor therein. In this embodiment, only one MOS transistor is depicted in the first area A, and one capacitor is depicted in the second are B to clarify and simplify the present invention, but the number of the MOS transistor or the capacitor is not restricted to one, it may be more than one, depending upon the needs. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

An isolation structure 10 is formed in the substrate 110 of the second area B. The isolation structure 10 may be a shallow trench isolation (STI) structure or other oxide structures, which may be formed by a shallow trench isolation process or other oxide processes, but it is not limited thereto. Thus, the substrate 110 and a later formed capacitor thereon can be isolated from each other by the isolation structure 10, or the capacitor and a later formed MOS transistor beside it can be electrically isolated from each other by the isolation structure 10. In this embodiment, the isolation structure 10 is a bulk isolation structure located in most part of the substrate 110 of the second area B for preventing the capacitor from electrically connecting the substrate 110, that leads to circuit leakage, but it is not limited thereto. In another embodiment, the isolation structure 10 in the substrate 110 of the second area B may be composed of a plurality of smaller isolation structures, depending upon the needs.

A MOS transistor 20 is formed on the substrate 110 of the first area A, and a sacrificial electrode 40 is formed on the substrate 110 of the second area B. In this embodiment, the sacrificial gate G1 of the MOS transistor 20 and the sacrificial electrode 40 are formed by the same processing steps, therefore simplifying the process. More precisely, a dielectric layer (not shown), an electrode layer (not shown) and a cap layer (not shown) are sequentially formed on the substrate 110 entirely; then, the cap layer, the electrode layer and the dielectric layer are patterned to form a gate dielectric layer 22, 42, a gate electrode layer 24, 44, and a cap layer 26, 46 stacked from bottom to top, thereby forming sacrificial gates G1 and G2, wherein the sacrificial gate G1 includes the gate dielectric layer 22, the gate electrode layer 24 and the cap layer 26 from bottom to top, while the sacrificial gate G2 includes the gate dielectric layer 42, the gate electrode layer 44 and the cap layer 46 from bottom to top. In this embodiment, the sacrificial gate G2 is located directly above the isolation structure 10, preventing circuit leakage flowing into the substrate 110 from occurring as the sacrificial gate G2 is an electrode of a capacitor. The spacer material layer (not shown) covers the sacrificial gates G1, G2 and the substrate 110 entirely, and the spacer material layer is patterned to form a spacer 28 on the substrate 110 beside the sacrificial gate G1 and a spacer 48 on the substrate 110 beside the sacrificial gate G2 simultaneously, thereby the sacrificial electrode 40 is formed on the substrate 110. A source/drain 29 is formed in the substrate 110 beside the spacer 28 to form the MOS transistor 20.

Moreover, as the aforesaid steps are performed or between when the aforesaid steps are performed, other processing steps of a MOS transistor can be performed to form the MOS transistor 20 having better performance. For instance, a lightly doped source/drain (not shown) may be selectively formed in the substrate 110 beside the sacrificial gate G1; an epitaxial structure (not shown) may be selectively formed in the substrate 110 beside the sacrificial gate G1 etc, and spacers (not shown) may be formed beside the sacrificial gate G1 before the lightly doped source/drain or the epitaxial structure is formed to adjust the distances between the lightly doped source/drain and the sacrificial gate G1 or the epitaxial structure and the sacrificial gate G1. The processing steps of the MOS transistor are known in the art, so are not described again.

Figure 2:
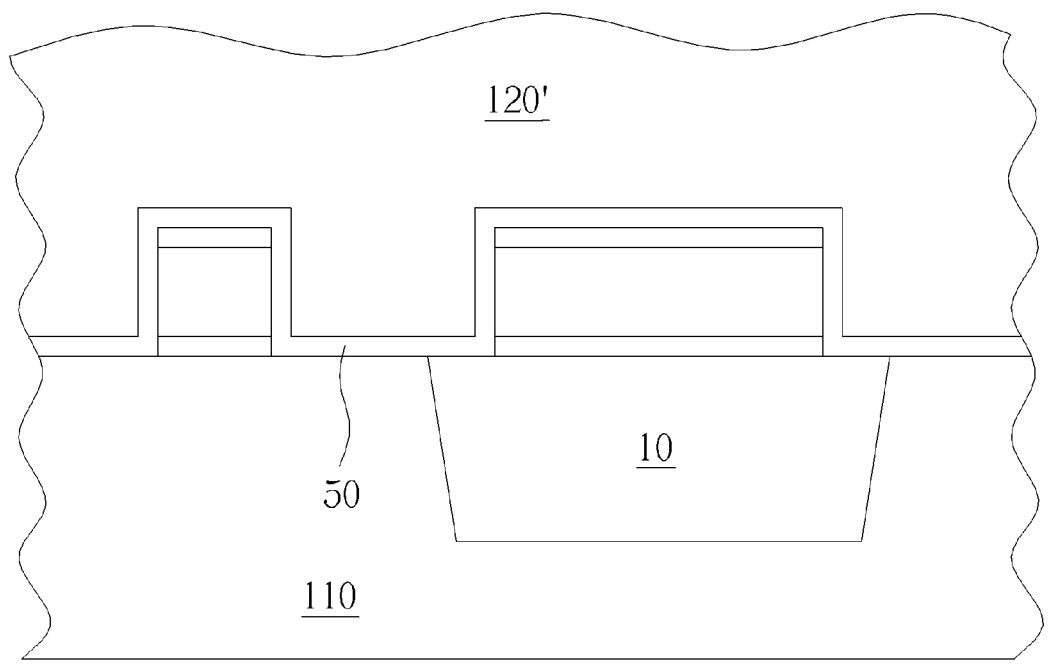
Figure 3:
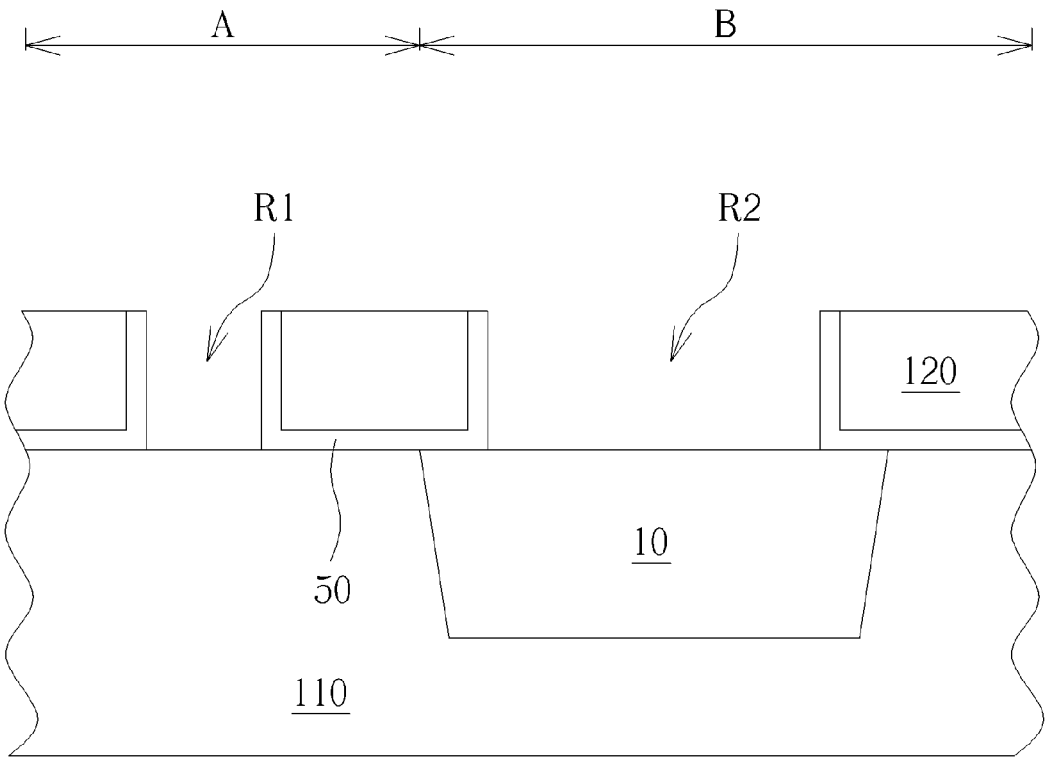

The spacers 28, 48 may be selectively removed as shown in FIG. 2. A contact etch stop layer 50 and a first dielectric layer 120' sequentially cover the sacrificial gate G1, the sacrificial gate G2 and the substrate 110. The contact etch stop layer 50 may be a nitride layer, a doped nitride layer, etc. The first dielectric layer 120' may be an oxide layer, which may be formed by a chemical vapor deposition (CVD) process, but it is not limited thereto. A planarization process (not shown) may be performed to form a planarized first dielectric layer 120, and remove the contact etch stop layer 50 on the sacrificial gates G1, G2; then, an etching process is performed to remove the sacrificial gate G1 and the sacrificial gate G2 and two recesses R1, R2 are therefore formed, as shown in FIG. 3. In another embodiment, part of the sacrificial gate G1 and the sacrificial gate G2 such as the cap layers 26, 46 may be removed while the planarization process is performed.

Figure 4:
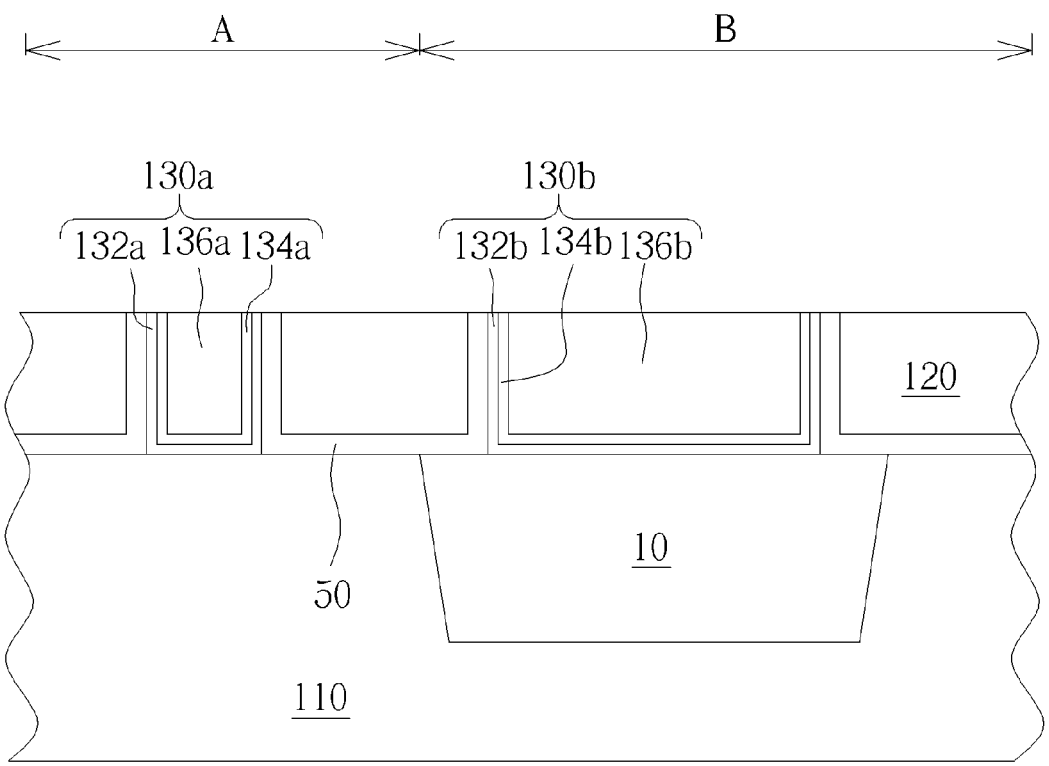

As shown in FIG. 4, a dielectric layer having a high dielectric constant (not shown), a work function metal layer (not shown) and a low resistivity material sequentially covers the recesses R1, R2 and the first dielectric layer 120; then, the low resistivity material, the work function metal layer and the dielectric layer having a high dielectric constant are planarized until the first dielectric layer 120 is exposed, therefore a U-shaped cross-sectional profile dielectric layer having a high dielectric constant 132a, 132b, a work function metal layer having a U-shaped cross-sectional profile 134a, 134b, and low resistivity material 136a 136b are filled in the recesses R1, R2 respectively, thereby a first metal gate 130a of the MOS transistor 20 is formed in the first dielectric layer 120 in the first area A, and a metal gate 130b is formed in the first dielectric layer 120 in the second area B. More precisely, the first metal gate 130a includes a U-shaped cross-sectional profile dielectric layer having a high dielectric constant 132a, a work function metal layer having a U-shaped cross-sectional profile 134a and a low resistivity material 136a; the metal gate 130b includes a U-shaped cross-sectional profile dielectric layer having a high dielectric constant 132b, a work function metal layer having a U-shaped cross-sectional profile 134b and a low resistivity material 136b. Thus, the metal gate 130b and the first metal gate 130a can be formed through the same process in the present invention, and the metal gate 130b and the first metal gate 130a are in the same level. In this embodiment, the isolation structure 10 is located directly below the metal gate 130b, therefore currents flowing from the metal gate 130b downward to the substrate 110 can be prevented. In the present invention, since the first metal gate 130a and the metal gate 130b serving as a lower electrode of a capacitor are formed through the same metal gate process, the material of the metal gate 130b (the same as that of the first metal gate 130a) is preferred not only to approach the electrical demand of the MOS transistor 20 but also to achieve the conductive demand and charge storage demand of a desired formed capacitor. Furthermore, the metal gate 130b and the first metal gate 130a may further include selective barriers (not shown) between the U-shaped cross-sectional profile dielectric layer having a high dielectric constant 132a, 132b, the work function metal layer having a U-shaped cross-sectional profile 134a, 134b and the low resistivity material 136a, 136b; and a buffer layer (not shown) between the U-shaped cross-sectional profile dielectric layer having a high dielectric constant 132a, 132b and the substrate 110.

The U-shaped cross-sectional profile dielectric layer having a high dielectric constant 132a, 132b may be selected from the group consisting of hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST); the work function metal layer having a U-shaped cross-sectional profile 134a, 134b may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc; the low resistivity material 136a, 136b may be composed of low resistivity materials such as aluminum, tungsten, titanium aluminum (TiAl) alloy, cobalt tungsten phosphide (CoWP), etc.

Figure 10:
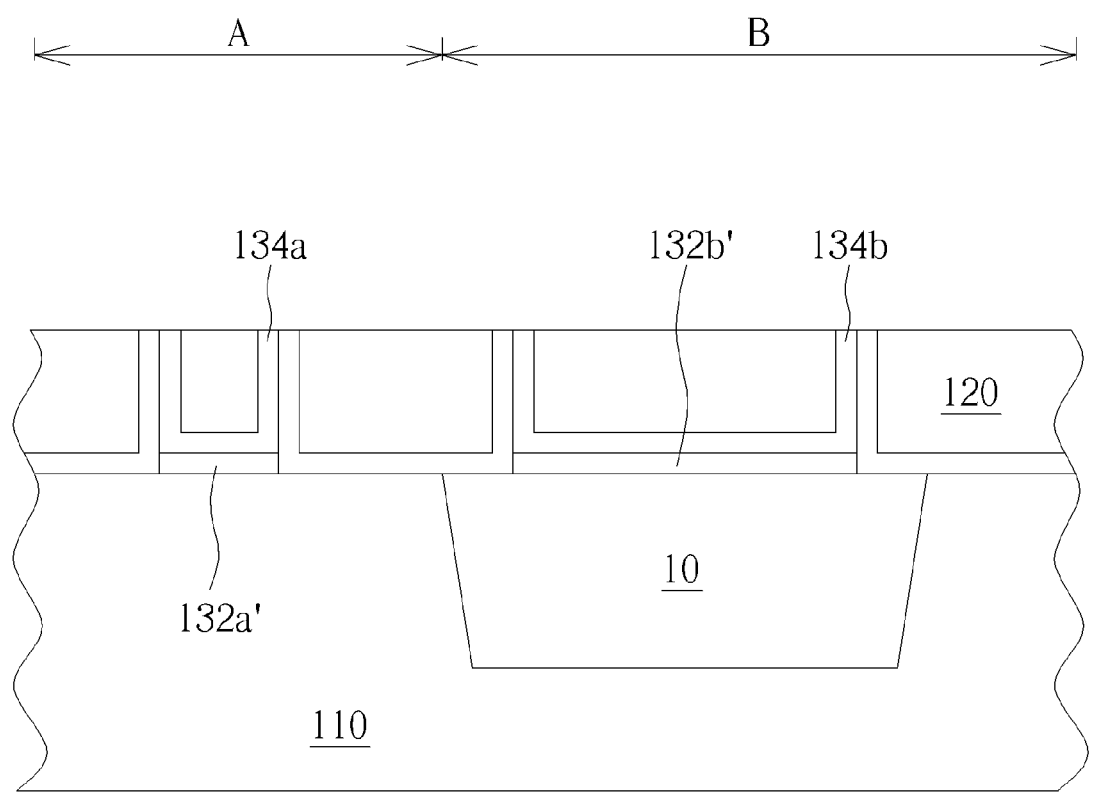
FIG. 10 schematically depicts a cross-sectional view of a semiconductor process according to an embodiment of the present invention.

A gate-last for high-k last process is applied in this embodiment, so there is the U-shaped cross-sectional profile dielectric layer having a high dielectric constants 132a, 132b surrounding the work function metal layer having a U-shaped cross-sectional profile 134a, 134b respectively. In another embodiment, a gate-last for high-k first process is applied, as shown in FIG. 10, which schematically depicts a cross-sectional view of a semiconductor process according to an embodiment of the present invention. The gate dielectric layer 22, 42 in this embodiment is a dielectric layer having a high dielectric constant without being removed later; in other words, as the recesses R1, R2 are formed (as shown in FIG. 3), the etching for forming the recesses R1, R2 is stopped while exposing the gate dielectric layer 22, 42. Then, a work function metal layer is stacked on the gate dielectric layer 22, 42, thereby a "⌐"-shaped cross-sectional profile dielectric layer having a high dielectric constant 132a', 132b' is formed between the work function metal layer having a U-shaped cross-sectional profile 134a, 134b and the substrate 110 (and the isolation structure 10). In this embodiment, the metal gate 130b and the first metal gate 130a are still formed through the same metal gate process.

Figure 5:
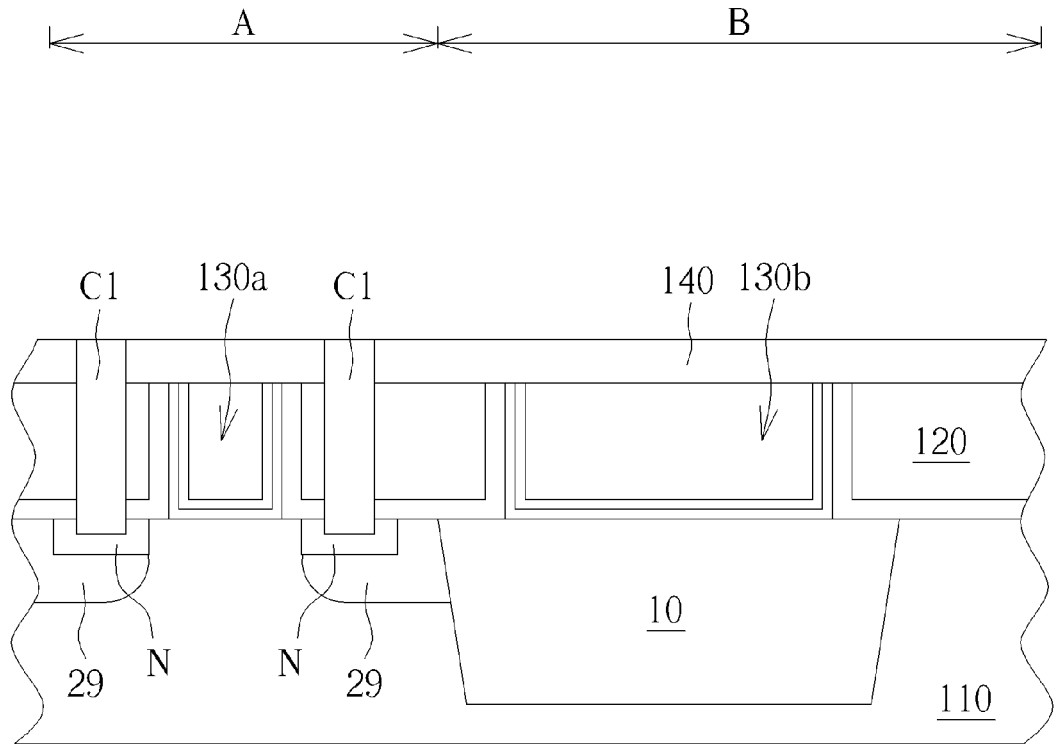

As shown in FIG. 5, a second dielectric layer 140 is formed on the metal gate 130b, the first metal gate 130a and the first dielectric layer 120. The second dielectric layer 140 may be an insulating material layer such as a nitride layer, an oxynitride layer, a carbon-containing silicon nitride layer or an oxide layer. In this embodiment, the second dielectric layer 140 is an insulating layer of a capacitor, thus the material is preferably the aforesaid insulating material layer, which can approach the electrical demand of the capacitor. Moreover, the MOS transistor 20 and the metal interconnect structure later formed thereon can be isolated from each other by the second dielectric layer 140.

The second dielectric layer 140 and the first dielectric layer 120 are patterned to form a plurality of first contact holes (not shown) in the second dielectric layer 140 and the first dielectric layer 120; then, conductive material is filled into the first contact holes to form a plurality of first contact plugs C1 in the second dielectric layer 140 and the first dielectric layer 120, and physically connect the source/drain 29 of the MOS transistor 20. The first contact plugs C1 may be composed of tungsten, aluminum, copper, etc. Furthermore, as the conductive material is filled and the first contact plugs C1 are formed, a salicide process may be selectively performed to form a metal silicide N between the source/drain 29 and the first contact plugs C1 in the first contacts hole, thereby contact resistance between the source/drain 29 and the first contact plugs C1 can being reduced. In another embodiment, a metal silicide can be formed on the source/drain 29 right after the source/drain 29 is formed, and then cover a dielectric layer entirely to form the first contact holes therein.

Figure 6:
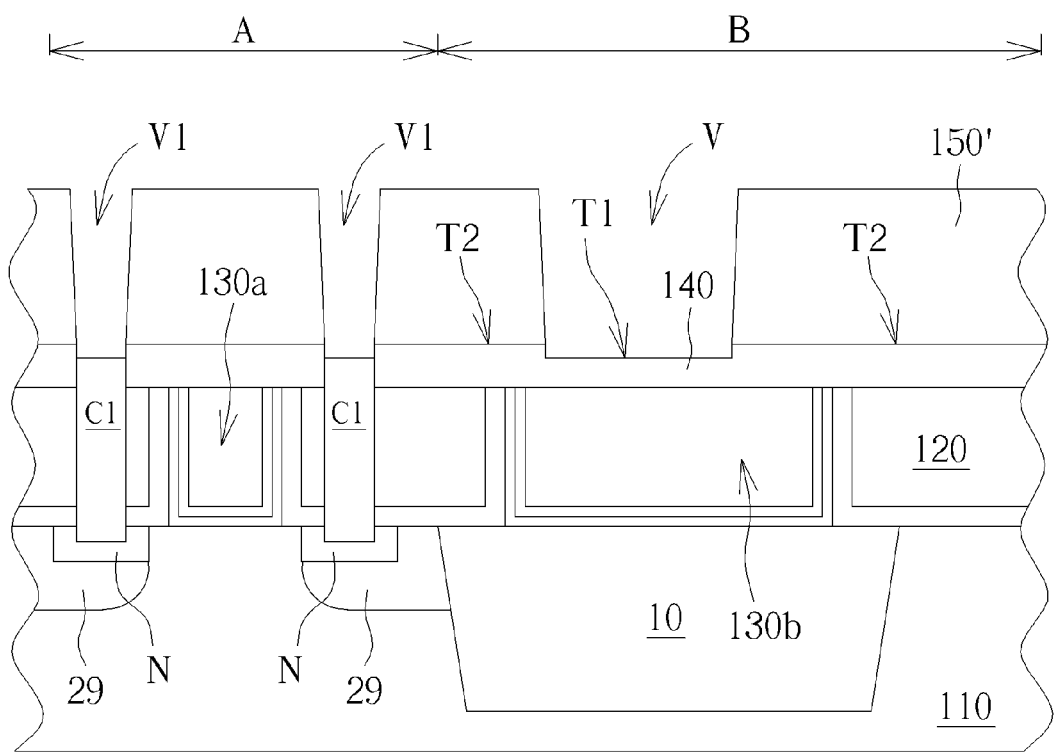
Figure 7:
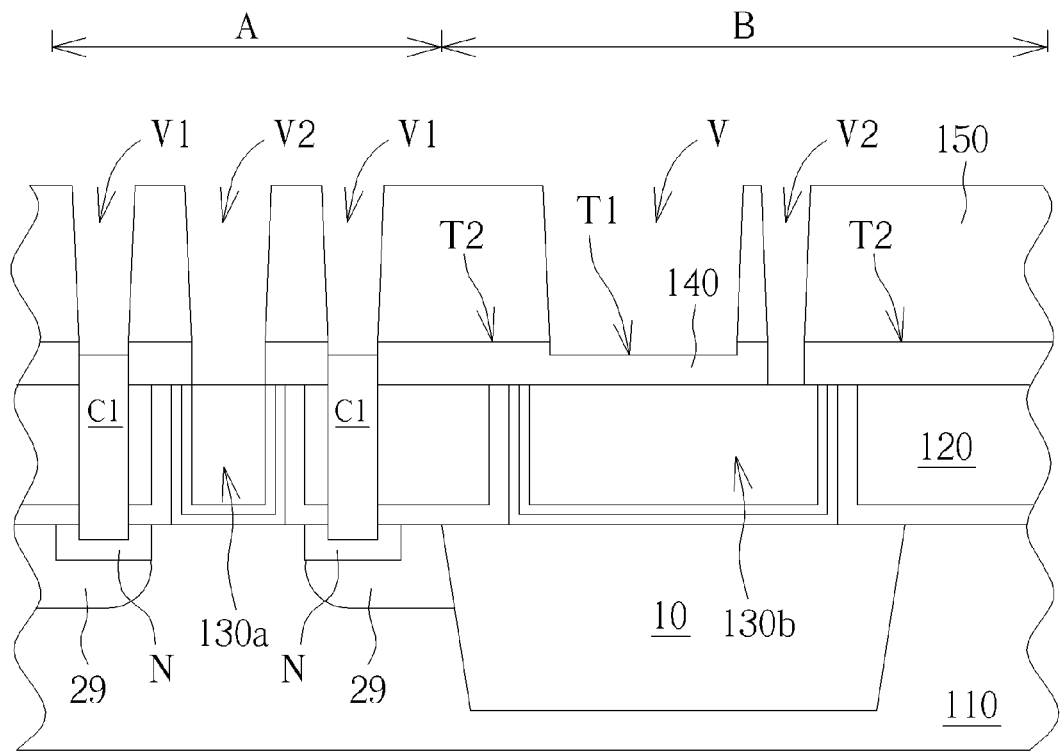

As shown in FIGS. 6-7, a third dielectric layer 150' is formed on the second dielectric layer 140. The third dielectric layer 150' may be an oxide layer, which may be a chemical vapor deposition (CVD) process, but it is not limited thereto. More precisely, a third dielectric layer (not shown) is covered entirely and then patterned to form a third dielectric layer 150' having two second contact holes V1 and one contact hole V and therefore exposing at least part of the first contact plugs C1 and the second dielectric layer 140 as shown in FIG. 6. The second dielectric layer 140 may be a single layer or a multi-layer. In a preferred embodiment, the second dielectric layer 140 is a multilayer, including at least two stacked material layers having different etching rates for an etching process. For example, as the second dielectric layer 140 is a multilayer having a nitride layer and an oxide layer stacked from bottom to top, the oxide layer can be an etch stop layer as an etching process is performed to form the second contact holes V1 and the contact hole V in the third dielectric layer 150', thus the etching can stop on the nitride layer without over-etching. By doing this, a part of a top surface T1 of the second dielectric layer 140 contacting the later formed contact plug in the contact hole V is lower than the other part of the top surface T2 of the second dielectric layer 140 beside the contact plug.

The third dielectric layer 150' is patterned to form the third dielectric layer 150 having two second contact holes V2 extending to the second dielectric layer 140 and therefore exposing at least part of the first metal gates 130a and the metal gate 130b as shown in FIG. 7.

Figure 8:
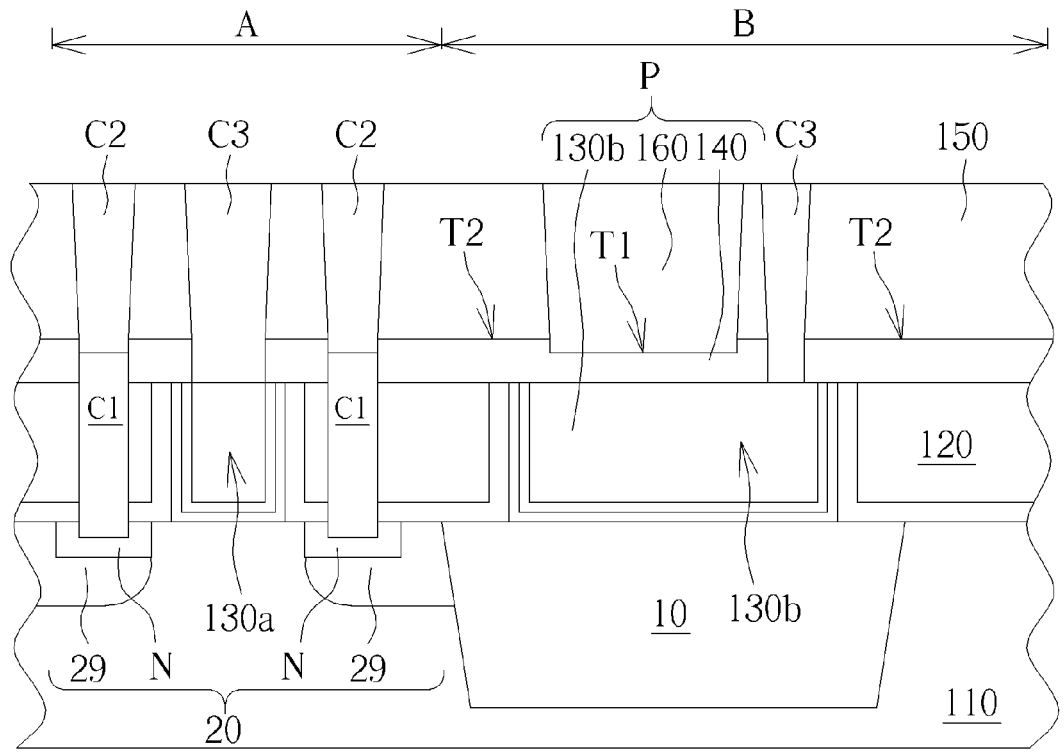

Conductive material (not shown) is filled into the contact hole V, the second contact holes V1 and V2 and then is planarized to form a contact plug 160 in the third dielectric layer 150, wherein the contact plug 160 is formed in a vertical direction of the metal gate 130b; and, to form two second contact plugs C2 physically connected to the first contact plugs C1 and two second contact plugs C3 physically connected to the first metal gate 130a and the metal gate 130b as shown in FIG. 8. In this embodiment, the second contact plugs C2, C3 and the contact plug 160 serving as a top electrode of a capacitor are formed in one contact plug process. This way, a fabrication of a capacitor P can be finished. The capacitor P is constituted by the contact plug 160 serving as a top electrode, the second dielectric layer 140 serving as an insulating layer and the metal gate 130b serving as a lower electrode. One end of the capacitor P can electrically connect outward by the second contact plug C3 physically connecting the metal gate 130b, and the MOS transistor 20 can electrically connect outward by the second contact plugs C2, C3 physically connecting the first contact plugs C1 and first metal gate 130a. The contact plugs 160 and the second contact plugs C2, C3 can be composed of aluminum, copper, tungsten, etc. In this embodiment, due to the contact plug 160 being a top electrode of a capacitor, the material of the contact plug 160 is preferred not only to achieve the electrical demand for the MOS transistor 20 electrically connecting outward, but also achieve the conductive demand for forming the capacitor.

Figure 9:
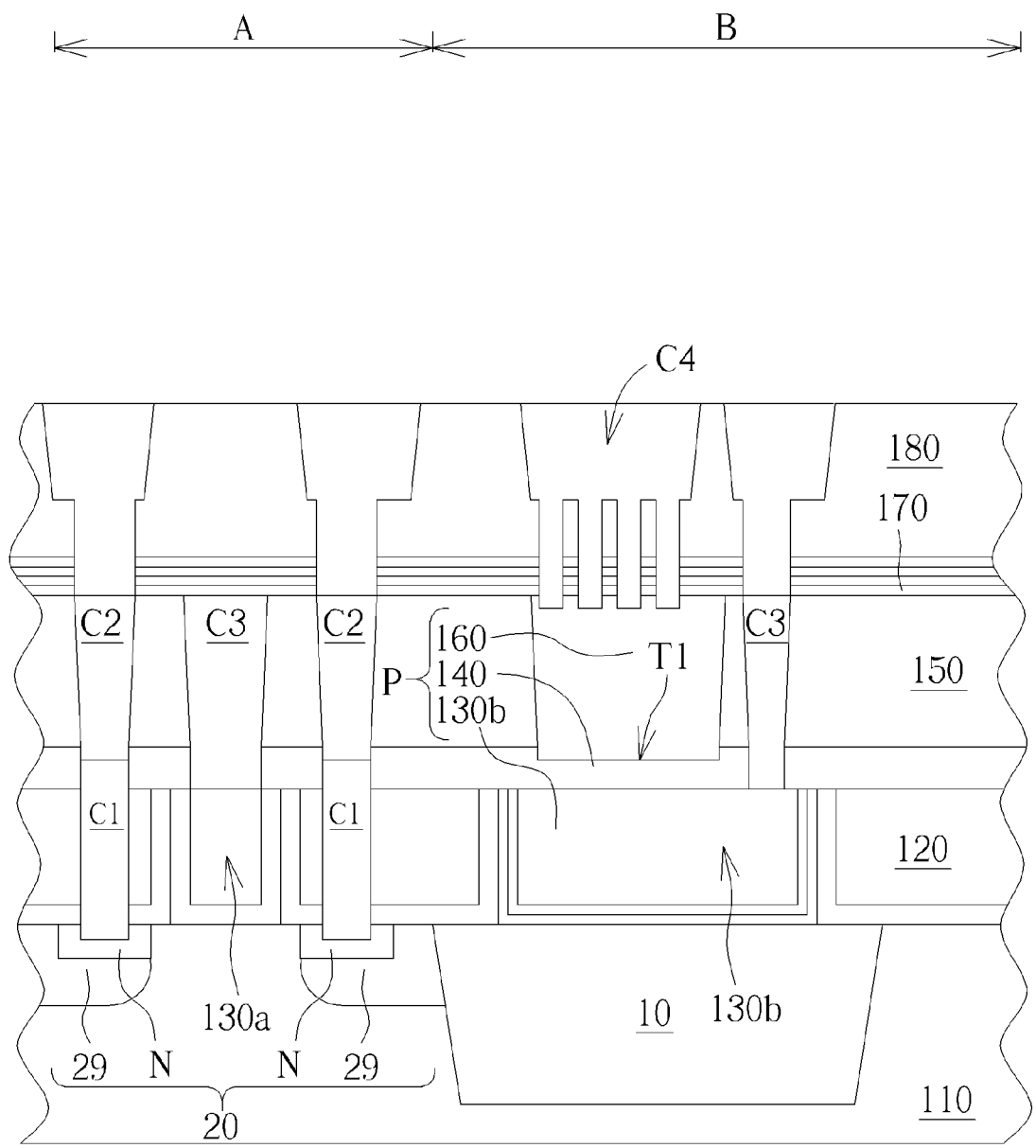

As shown in FIG. 9, a forth insulating layer 170 and a fifth insulating layer 180 are sequentially formed on the third dielectric layer 150, the contact plug 160 and the second contact plugs C2, C3, and an interconnect structure C4 is formed in the forth insulating layer 170 and the fifth insulating layer 180. More precisely, a fourth insulating layer (not shown) and a fifth insulating layer (not shown) sequentially cover the third dielectric layer 150, the contact plug 160 and the second contact plugs C2, C3 entirely, and then the fifth insulating layer and the forth insulating layer are patterned by dual damascene processes such as trench first process, via first process or self-aligned process etc to form recesses (not shown) and holes (not shown) in the forth insulating layer 170 and the fifth insulating layer 180. Then, conductive material (not shown) is filled into the recesses and is planarized to form the interconnect structure C4 in the fourth insulating layer 170 and the fifth insulating layer 180. The interconnect structure C4 physically connects the contact plug 160, and one end of the capacitor P can therefore electrically connect outward. Furthermore, the MOS transistor 20 electrically connects outward by the interconnect structure C4 physically connecting the second contact plugs C2. In this embodiment, the interconnect structure C4 has a plurality of dual damascene structures, but it is not limited thereto. The interconnect structure C4 may be composed of aluminum, copper, etc.

To summarize, the present invention provides a semiconductor structure and a process thereof, which integrates a capacitor process and a MOS transistor process to form transistors and capacitors in the same process, thereby simplifying processing steps and reducing processing costs. More specifically, a lower electrode of a capacitor is formed together with a metal gate of a MOS transistor, therefore the lower electrode and the metal gate having the same structure including a work function metal layer having a U-shaped cross-sectional profile and a low resistivity material located on the work function metal layer having a U-shaped cross-sectional profile, and the lower electrode of the capacitor being the same level as the metal gate of the MOS transistor; a second dielectric layer is covered on the MOS transistor and the lower electrode of the capacitor to be an insulating layer of the capacitor and insulating the MOS transistor from upwards; and a top electrode of the capacitor is formed together with a second contact plug of the MOS transistor, which electrically connects the MOS transistor outwards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a metal gate located on a substrate and in a first dielectric layer, wherein the metal gate has a work function metal layer having a U-shaped cross-sectional profile and a low resistivity material located on the work function metal layer having a U-shaped cross-sectional profile;
   a second dielectric layer located on the metal gate and the first dielectric layer; and
   a contact plug located on the second dielectric layer and in a third dielectric layer, thereby forming a capacitor with the second dielectric layer sandwiched by the metal gate and the contact plug.

2. The semiconductor structure according to claim 1, further comprising:
   an isolation structure located in the substrate and directly below the metal gate.

3. The semiconductor structure according to claim 1, wherein the metal gate further comprises a U-shaped cross-sectional profile dielectric layer having a high dielectric constant located below the work function metal layer having a U-shaped cross-sectional profile.

4. The semiconductor structure according to claim 1, wherein the metal gate further comprises a "—"-shaped cross-sectional profile dielectric layer having a high dielectric constant located between the work function metal layer having a U-shaped cross-sectional profile and the substrate.

5. The semiconductor structure according to claim 1, wherein the work function metal layer having a U-shaped cross-sectional profile comprises a titanium nitride layer, an aluminum titanium layer, or a titanium carbide.

6. The semiconductor structure according to claim 1, wherein the low resistivity material comprises tungsten or aluminum.

7. The semiconductor structure according to claim 1, wherein the second dielectric layer comprises a nitride layer, an oxynitride layer, a carbon-containing silicon nitride layer or an oxide layer.

8. The semiconductor structure according to claim 1, wherein the second dielectric layer is a single layer or a multilayer.

9. The semiconductor structure according to claim 1, wherein the second dielectric layer comprises stacked two material layers having different etching rates for an etching process.

10. The semiconductor structure according to claim 1, wherein a part of a top surface of the second dielectric layer contacting the contact plug is lower than the other part of the top surface of the second dielectric layer beside the contact plug.

11. The semiconductor structure according to claim 1, further comprising:
    a MOS transistor comprising a first metal gate, and the first metal gate is in the same level as the metal gate.

12. The semiconductor structure according to claim 11, further comprising:
    a plurality of first contact plugs located in the second dielectric layer and the first dielectric layer, and physically connecting a source/drain of the MOS transistor.

13. The semiconductor structure according to claim 11, further comprising:
    a plurality of second contact plugs located in the third dielectric layer, and physically connecting the metal gate and the MOS transistor.

* * * * *